(12) United States Patent
Borland et al.

(10) Patent No.: US 8,294,024 B2
(45) Date of Patent: *Oct. 23, 2012

(54) PROCESSES FOR FORMING PHOTOVOLTAIC DEVICES

(75) Inventors: William J. Borland, Chapel Hill, NC (US); Jon-Paul Maria, Raleigh, NC (US)

(73) Assignees: E I du Pont de Nemours and Company, Wilmington, DE (US); North Carolina State University, Raleigh, NC (US)

( * ) Notice: Subject to any disclaimer, the term of this patent is extended or adjusted under 35 U.S.C. 154(b) by 413 days.

This patent is subject to a terminal disclaimer.

(21) Appl. No.: 12/536,238

(22) Filed: Aug. 5, 2009

(65) Prior Publication Data

US 2010/0037942 A1 Feb. 18, 2010

Related U.S. Application Data

(60) Provisional application No. 61/088,504, filed on Aug. 13, 2008.

(51) Int. Cl.
*H01L 31/07* (2006.01)

(52) U.S. Cl. .................................................. 136/255

(58) Field of Classification Search .................. 136/255
See application file for complete search history.

(56) References Cited

U.S. PATENT DOCUMENTS

| | | | |
|---|---|---|---|
| 3,381,182 A | 4/1968 | Thornton | |
| 3,968,272 A | 7/1976 | Anand | |
| 4,105,471 A | 8/1978 | Yerkes et al. | |
| 4,278,704 A | 7/1981 | Williams | |
| 4,394,673 A | 7/1983 | Thompson et al. | |
| 4,486,232 A | 12/1984 | Nakatani et al. | |
| 4,643,913 A | 2/1987 | Okunaka et al. | |
| 4,737,197 A | 4/1988 | Nagahara et al. | |
| 5,118,362 A | 6/1992 | St. Angelo et al. | |
| 5,405,466 A * | 4/1995 | Naito et al. ................. | 156/89.17 |
| 5,429,657 A | 7/1995 | Glicksman et al. | |

(Continued)

FOREIGN PATENT DOCUMENTS

EP    1386708 A2 *  2/2004

(Continued)

OTHER PUBLICATIONS

Andrews, J. M., The role of the metal-semiconductor interface in silicon integrated circuit technology, J. Vac. Sci. Technol., Nov./Dec. 1974, pp. 972-984, vol. 11, No. 6, the American Vacuum Society.

(Continued)

*Primary Examiner* — Jennifer Michener
*Assistant Examiner* — Dustin Q Dam

(57) ABSTRACT

Photovoltaic cells, including silicon solar cells, and methods and compositions for making such photovoltaic cells are provided. A silicon substrate having an n-type silicon layer is provided with a silicon nitride layer, a reactive metal in contact with said silicon nitride layer, and a non-reactive metal in contact with the reactive metal. This assembly is fired to form a low Schottky barrier height contact comprised of metal nitride, and optionally metal silicide, on the silicon substrate, and a conductive metal electrode in contact with said low Schottky barrier height contact. The reactive metal may be titanium, zirconium, hafnium, vanadium, niobium, and tantalum, and combinations thereof, and the non-reactive metal may be silver, tin, bismuth, lead, antimony, arsenic, indium, zinc, germanium, nickel, phosphorus, gold, cadmium, beryllium, and combinations thereof.

17 Claims, 8 Drawing Sheets

U.S. PATENT DOCUMENTS

| | | | |
|---|---|---|---|
| 5,698,451 | A | 12/1997 | Hanoka |
| 5,928,405 | A | 7/1999 | Ranade et al. |
| 6,679,938 | B1 | 1/2004 | Kim et al. |
| 7,741,013 | B2 * | 6/2010 | Keusseyan .................. 430/311 |
| 2004/0231758 | A1 | 11/2004 | Hampden-Smith et al. |
| 2006/0231801 | A1 | 10/2006 | Carroll et al. |
| 2007/0137692 | A1 * | 6/2007 | Carlson ........................ 136/252 |
| 2007/0148336 | A1 | 6/2007 | Bachrach et al. |
| 2009/0101190 | A1 | 4/2009 | Salami et al. |
| 2009/0159121 | A1 | 6/2009 | Yang et al. |
| 2010/0037939 | A1 * | 2/2010 | Eickelmann et al. ......... 136/255 |
| 2010/0037941 | A1 | 2/2010 | Borland et al. |
| 2010/0037942 | A1 | 2/2010 | Borland et al. |
| 2010/0071754 | A1 | 3/2010 | Chang et al. |
| 2010/0163101 | A1 | 7/2010 | Kumar et al. |

FOREIGN PATENT DOCUMENTS

| | | |
|---|---|---|
| EP | 2172978 A2 | 4/2010 |
| FR | 2549290 A1 | 1/1985 |
| JP | 2004207493 A | 7/2004 |
| WO | 8907343 A1 | 8/1989 |
| WO | 2008134417 A1 | 11/2008 |
| WO | 2009009512 A1 | 1/2009 |
| WO | 2009048983 A2 | 4/2009 |
| WO | 2010019532 A2 | 2/2010 |

OTHER PUBLICATIONS

Richardson, F. D. et al., The Thermodynamics of Substances of Interest in Iron and Steel Making from 0 degrees C to 2400 degrees C, Journal of The Iron and Steel Institute, Nov. 1948, pp. 261-270.

Bahr, M. et al., A New Approach for the Front Side Metallization of Industrial Type Silicon Solar Cells Using Structurization by Etching, Presented at the 22nd European Photovoltaic Solar Energy Conference, Sep. 3-9, 2007, Milan, Italy.

Hansen, Max, Constitution of Binary Alloys, Second Edition, 1958, pp. 504-505, 1040-1041, McGraw-Hill Book Company.

Lee, S. H., Cost Effective Process for high-efficiency solar cells, Nanotechnology Materials and Devices Conference, IEEE, Oct. 22, 2006, pp. 526-528, Piscataway, NJ.

Saito, T. et al., Solar energy absorber mfd. From composite layer containing metal matrix and particles of metal, boride, carbide, nitride, silicide, oxide, graphite, or carbon, WPI/Thomson, Jul. 22, 1982, Matsushita Electric Works, Ltd.

Kim, Joondong et al., Metal silicide-mediated microcrystalline silicon thin-film growth for photovoltaics, Solar Energy Materials & Solar Cells, 2007, pp. 534-538, vol. 91, Elsevier, B.V.

U.S. Appl. No. 12/536,227, filed Aug. 5, 2009.
U.S. Appl. No. 12/539,677, filed Aug. 12, 2009.
U.S. Appl. No. 12/617,929, filed Nov. 13, 2009.

* cited by examiner

PROCESSES FOR FORMING PHOTOVOLTAIC DEVICES

FIELD OF THE INVENTION

This invention is directed primarily to a silicon solar cell device. In particular, it is directed to compositions and processes for use in forming electrical contacts to the n-type silicon of a solar cell device.

BACKGROUND OF THE INVENTION

The present invention can be applied to a range of semiconductor devices, although it is especially effective in light-receiving elements such as photodetectors and solar cells. The background of the invention is described below with reference to solar cells as a specific example of the prior art.

Conventional terrestrial solar cells are generally made of thin wafers of silicon (Si) in which a rectifying or p-n junction has been created and electrode contacts, that are electrically conductive, have been subsequently formed on both sides of the wafer. A solar cell structure with a p-type silicon base has a positive electrode contact on the base or backside and a negative electrode contact on the n-type silicon or emitter that is the front-side or sun-illuminated side of the cell. The "emitter" is a layer of silicon that is doped in order to create the rectifying or p-n junction and is thin in comparison to the p-type silicon base. It is well-known that radiation of an appropriate wavelength incident on a p-n junction of a semiconductor body serves as a source of external energy to generate hole-electron pairs in that body. Because of the potential difference which exists at a p-n junction, holes and electrons move across the junction in opposite directions. The electrons move to the negative electrode contact, and the holes move to positive electrode contact, thereby giving rise to flow of an electric current that is capable of delivering power to an external circuit. The electrode contacts to the solar cell are important to the performance of the cell. A high resistance silicon/electrode contact interface will impede the transfer of current from the cell to the external electrodes and therefore, reduce efficiency.

Most industrial crystalline silicon solar cells are fabricated with a silicon nitride anti-reflective coating (ARC) on the front-side to maximize sunlight absorption. As disclosed in a number of publications, such as US Patent Application US 2006/0231801 to Carroll et al., front side electrode contacts are generally made by screen printing a conductive paste on the anti-reflective coating followed by firing at an elevated temperature. Conventional front electrode silver pastes contain silver powder, an organic binder, a solvent, a glass frit and may contain various additives. The silver powder functions as the main electrode contact material and provides for low resistance. The glass frit may contain lead or other low melting point constituents to give a softening point of about 300 to 600° C. so that during firing, it becomes molten and functions as the "fire through" agent wherein the silicon nitride is penetrated to allow the silver to make contact to the n-type silicon. The glass frit also provides for adhesion of the sintered silver to the silicon. Additives may be used as additional dopants to modify the n-type conductivity. During firing, the conductive paste sinters and penetrates through the silicon nitride film and is thereby able to electrically contact the n-type silicon layer. This type of process is generally called "fire through" or "etching" of the silicon nitride. The interface structure after firing consists of multiple phases: substrate silicon; silver-silicon islands; silver precipitates within an insulating glass layer; and bulk sintered silver. As a result, the contact mechanism is a mix of ohmic contact by the silver-silicon islands and silver precipitates and tunneling through thin layers of the glass. Compositions and firing profiles of the conductive paste are optimized to maximize cell efficiency. However, the presence of glass at the metal-silicon (MS) interface inevitably results in a higher contact resistance than would be realized by a pure metal contact to silicon.

Difficulties associated with forming low resistance contacts to bipolar silicon devices exist. All elemental semiconductor contacts have a potential barrier that makes the contact rectifying. A Schottky barrier height (SBH) is the rectifying barrier for electrical conduction across an MS junction and, therefore, is of vital importance to the successful operation of any semiconductor device. The magnitude of the SBH reflects the mismatch in the energy position of the majority carrier band edge of the semiconductor and the metal Fermi level across the MS interface. At a metal/n-type semiconductor interface, the SBH is the difference between the conduction band minimum and the Fermi level. The lower the SBH, the better the contact to silicon. Low Schottky barrier height contacts to n-type silicon semiconductor devices are known. U.S. Pat. Nos. 3,381,182, 3,968,272 and 4,394,673, for example, disclose various silicides that form low SBH contacts to bipolar silicon devices when the metal is placed in contact with the silicon and heated. Such silicide contacts have not been used as front face electrode contacts to silicon solar cells.

FIG. 1 is a process flow diagram, shown in side elevation, illustrating the fabrication of a semiconductor device using conventional processes and materials.

In FIG. 1A, a p-type silicon substrate 10 is provided. The substrate may be composed of single-crystal silicon or of multicrystalline silicon. As shown in FIG. 1B, in the case of a p-type substrate, an n-type layer 20 in FIG. 1B, is formed to create a p-n junction. The method used to form the n-type layer is generally by the thermal diffusion of a donor dopant, preferably phosphorus (P), using phosphorus oxychloride ($POCl_3$). The depth of the diffusion layer is generally about 0.3 to 0.5 micrometers (μm). The phosphorus doping causes the surface resistance of the silicon to be reduced to between several tens of ohms per square (Ω/□) to something less than 100 ohms per square (Ω/□). In the absence of any particular modification, the diffusion layer 20 is formed over the entire surface of the silicon substrate 10.

Next, one surface of this diffusion layer is protected with a resist or the like and the diffusion layer 20 is removed from all but one surface of the article of FIG. 1B by etching. The resist is removed, leaving the article of FIG. 1C.

Next, as shown in FIG. 1D, an insulating silicon nitride $Si_3N_4$ film, or a silicon nitride SiNx:H film is formed on the above-described n-type diffusion layer to form an anti-reflective coating (ARC). The thickness of the $Si_3N_4$ or SiNx:H anti-reflective coating 30 is about 700 to 900 Å. As an alternative to the silicon nitride, silicon oxide may be used as an anti-reflection coating.

As shown in FIG. 1E a silver paste 50 for the front electrode is screen printed and then dried over the silicon nitride film 30. In addition, an aluminum paste 60 and a backside silver or silver/aluminum paste 70 are then screen printed and successively dried on the backside of the substrate. Co-firing of front and backside pastes is then carried out in an infrared furnace at a temperature range of approximately 700° C. to 975° C. in air for a period of from several minutes to several tens of minutes.

As shown in FIG. 1F, aluminum diffuses from the aluminum paste into the silicon substrate 10 as a dopant during firing, forming a p+ layer 40 containing a high concentration of aluminum dopant. This layer is generally called the back surface field (BSF) layer, and helps to improve the energy conversion efficiency of the solar cell.

Firing also converts the aluminum paste 60 to an aluminum back electrode 61. The backside silver or silver/aluminum paste 70 is fired at the same time, becoming a silver or silver/aluminum back electrode 71. During firing, the boundary between the back side aluminum and the back side silver or silver/aluminum assumes an alloy state, thereby achieving electricial connection. The aluminum electrode accounts for most areas of the back electrode, owing in part to the need to form a p+ layer 40. Because soldering to an aluminum electrode is impossible, a silver back tab electrode is formed over portions of the back side as an electrode for interconnecting solar cells by means of copper ribbon or the like.

During the co-firing, the front electrode-forming silver paste 50 sinters and penetrates through the silicon nitride film 30, and is thereby able to electrically contact the n-type layer 20. This type of process is generally called "fire through" or "etching" of the silicon nitride This fired through state is apparent in layer 51 of FIG. 1F.

Novel compositions and processes for forming front electrode contacts of photovoltaic devices are needed, which provide superior reduction in contact resistance and maintain adhesion. Novel compositions and methods for forming front electrode contacts to silicon solar cells are needed that eliminate the presence of a glass interface and provide superior contact resistance while maintaining adhesion.

SUMMARY OF THE INVENTION

A method for making a photovoltaic device is disclosed in which a silicon substrate having an n-type silicon layer is provided. A silicon nitride layer is formed on the n-type silicon layer of the silicon substrate. A reactive metal is placed in contact with said silicon nitride layer and a non-reactive metal is placed in contact with the reactive metal. The silicon substrate, silicon nitride layer, reactive metal and non-reactive metal are fired to form a low Schottky barrier height contact to the n-type silicon layer and a conductive metal electrode in contact with the low Schottky barrier height contact. The low Schottky barrier height contact is comprised of one or more metal nitrides, and may be further comprised of one or more metal silicides. The reactive metal is preferably one or more metals from the group of titanium, zirconium, hafnium, vanadium, niobium, tantalum, and combinations thereof. The non-reactive metal is preferably from the group of silver, tin, bismuth, lead, antimony, zinc, indium, germanium, nickel, phosphorus, gold, cadmium, berrylium, and combinations thereof.

In one preferred embodiment, the reactive metal and the non-reactive metal are combined to form a metals composition that is subsequently deposited on the silicon nitride layer. In one embodiment, the reactive metal is in the form of particles having an average diameter in the range of 100 nanometers to 50 micrometers, and the non-reactive metal may also be in the form of particles having an average diameter in the range of 100 nanometers to 50 micrometers. Preferably, the reactive metal forms between 1 and 25 weight percent of the total metals in said composition.

In one embodiment, the silicon substrate, silicon nitride layer, reactive metal and non-reactive metal are fired at a temperature between 400° C. and 1000° C. In one preferred embodiment, the firing is conducted in a reducing atmosphere.

A method for making a silicon solar cell is also disclosed. According to this method, a silicon substrate having an n-type silicon layer is provided and a silicon nitride antireflective layer is formed on the n-type silicon layer of the silicon substrate. A reactive metal is placed in contact with the silicon nitride antireflective layer. The silicon substrate, silicon nitride layer, and reactive metal are fired to form a low Schottky barrier height contact to the n-type silicon layer. The low Schottky barrier height contact comprised of one or more metal nitrides, may also comprise one or more metal silicides.

In a preferred embodiment, a non-reactive metal is placed in contact with the reactive metal before firing, so as to form a conductive metal electrode in contact with the low Schottky barrier height contact.

The reactive metal is preferably one or more metals selected from titanium, zirconium, hafnium, vanadium, niobium, and tantalum, and the non-reactive metal is preferably one or more metals selected from silver, tin, bismuth, lead, antimony, arsenic, zinc, indium, germanium, nickel, phosphorus, gold, cadmium, and berrylium.

The reactive and non-reactive metals may be placed in contact with the silicon nitride antireflective layer by thin film deposition. Alternatively, the reactive and non-reactive metals may be placed in contact with the silicon nitride antireflective layer by thick film depositon.

A thick film composition for producing a photovoltaic cell is also provided. The composition includes one or more metals that are reactive with silicon nitride selected from the group of titanium, zirconium, hafnium, vanadium, niobium, and tantalum and combinations thereof. The composition also includes one or more non-reactive metals selected from silver, tin, bismuth, lead, antimony, arsenic, zinc, indium, germanium, nickel, phosphorus, gold, cadmium, and berrylium. The reactive and non-reactive components are dispersed in an organic medium. The reactive metals and non-reactive metals are in the form of particles having an average diameter in the range of 100 nanometers to 50 micrometers.

Figure 1A:
FIG. 1 is a process flow diagram, shown in side elevation, illustrating the fabrication of a semiconductor device according to conventional processes and materials.
Figure 1B:
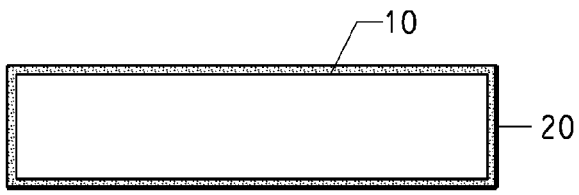
Figure 1C:

Reference numerals shown in FIG. 1 are explained below.
10: p-type silicon substrate
20: n-type diffusion layer
30: anti-reflective coating
40: p+ layer (back surface field, BSF)
50: silver paste formed on front side
51: silver front electrode (obtained by firing front side silver paste)
60: aluminum paste formed on backside
61: aluminum back electrode (obtained by firing back side aluminum paste)
70: silver or silver/aluminum paste formed on backside
71: silver or silver/aluminum back electrode (obtained by firing back side silver paste)

Figure 2:
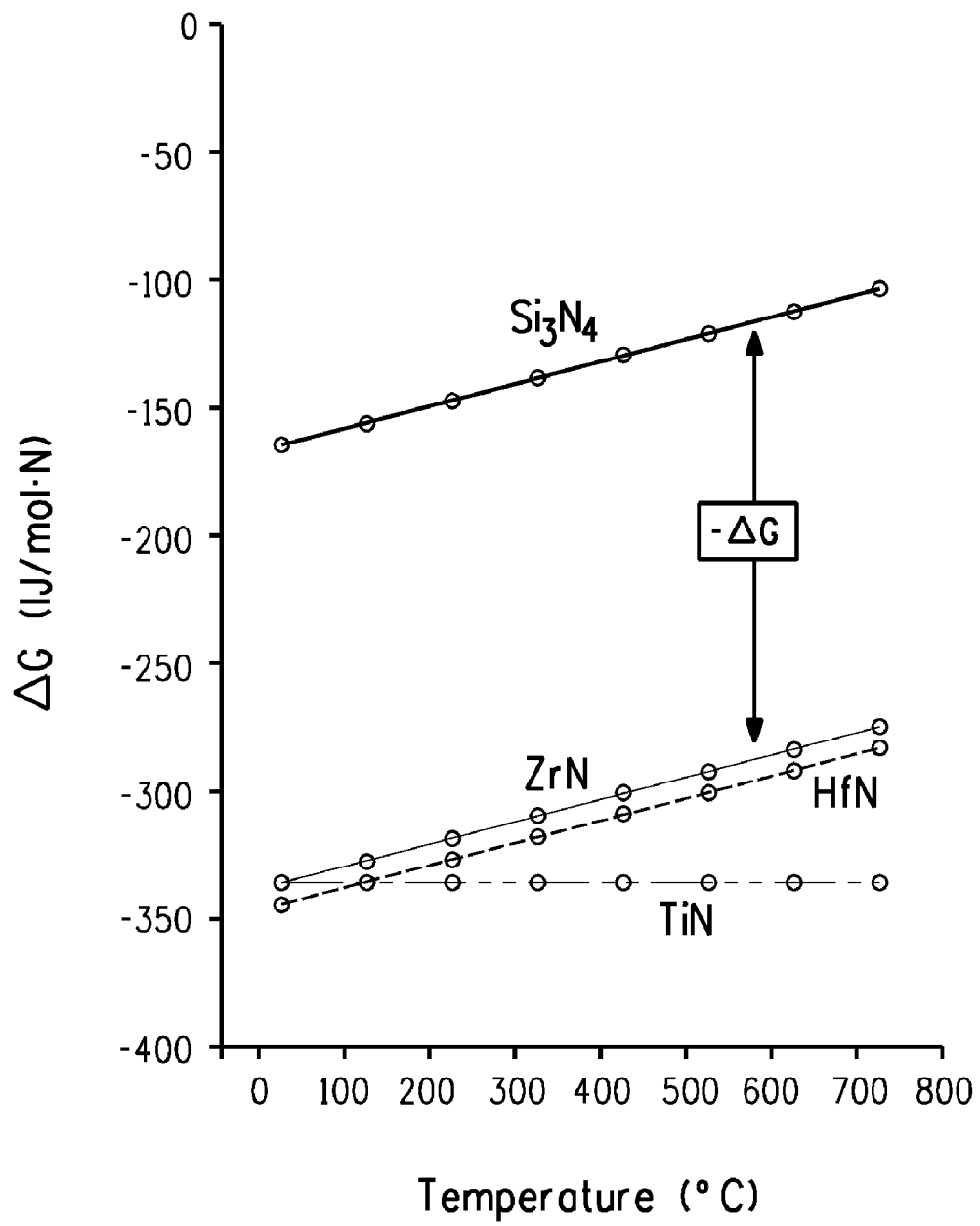

FIG. 2 shows a graph of free energy (Delta G) versus temperature illustrating the large difference in energy of formation between silicon nitride and the nitrides of titanium, zirconium and hafnium.

Figure 3:
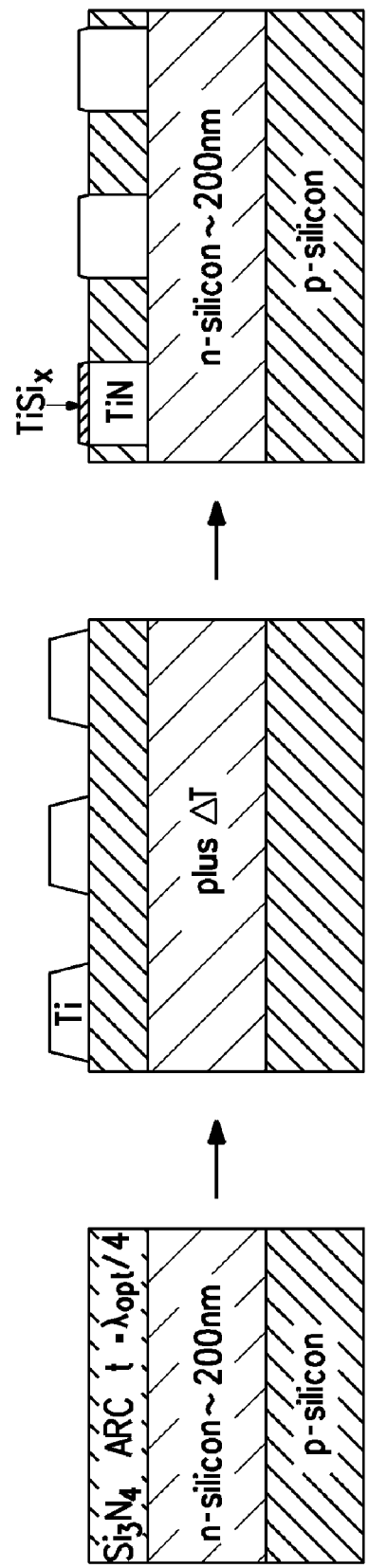

FIG. 3 is a schematic illustration of the transformation reaction of the silicon nitride anti-reflective coating to a conductive metal nitride and metal silicide by a reactive metal, such as titanium.

Figure 4:
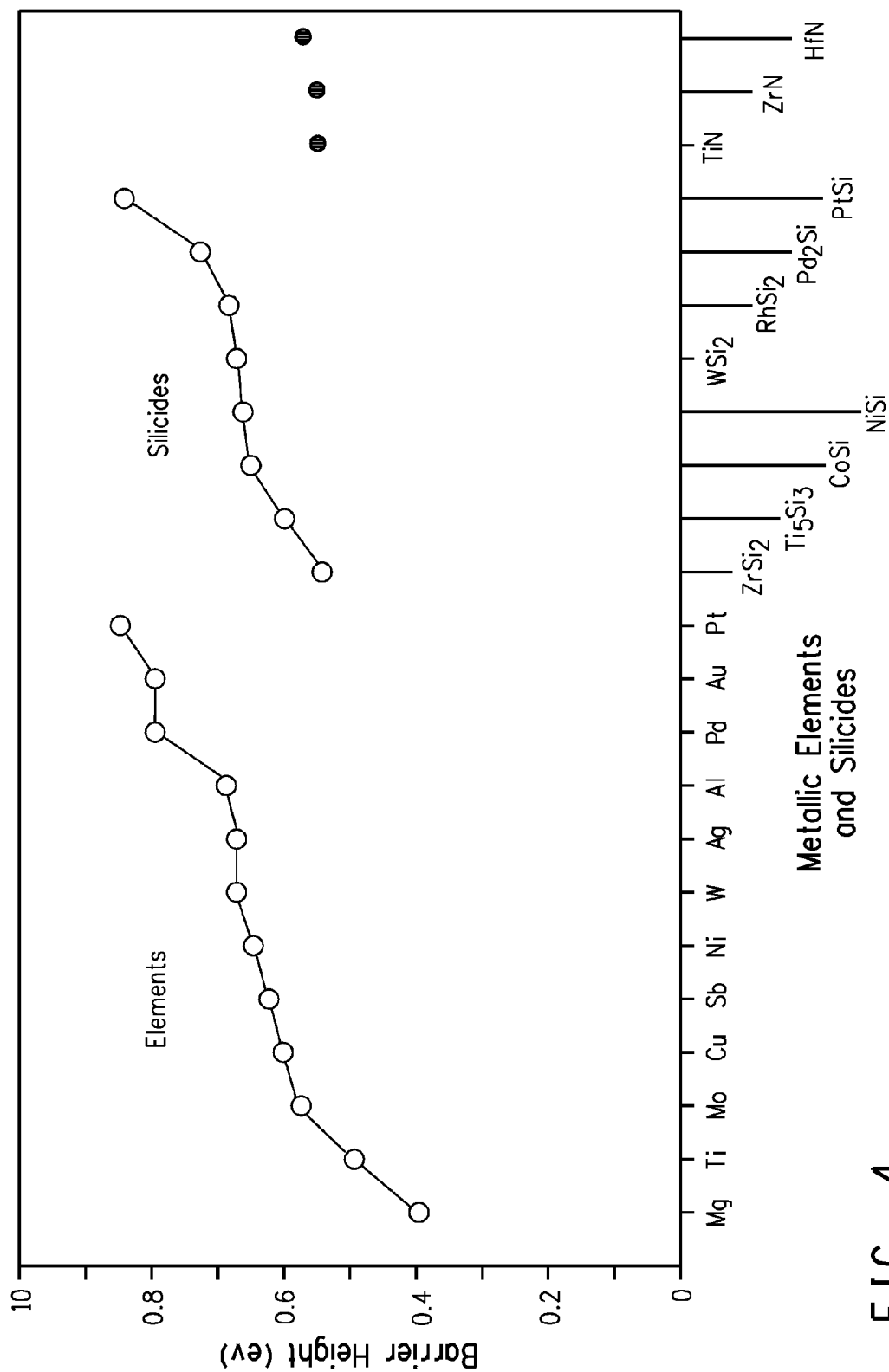

FIG. 4 shows Schottky barrier heights of various metals, silicides and nitrides to n-type silicon.

FIG. 5 shows in side elevation a method of manufacturing a silicon solar cell according to the present invention.

Figure 6:
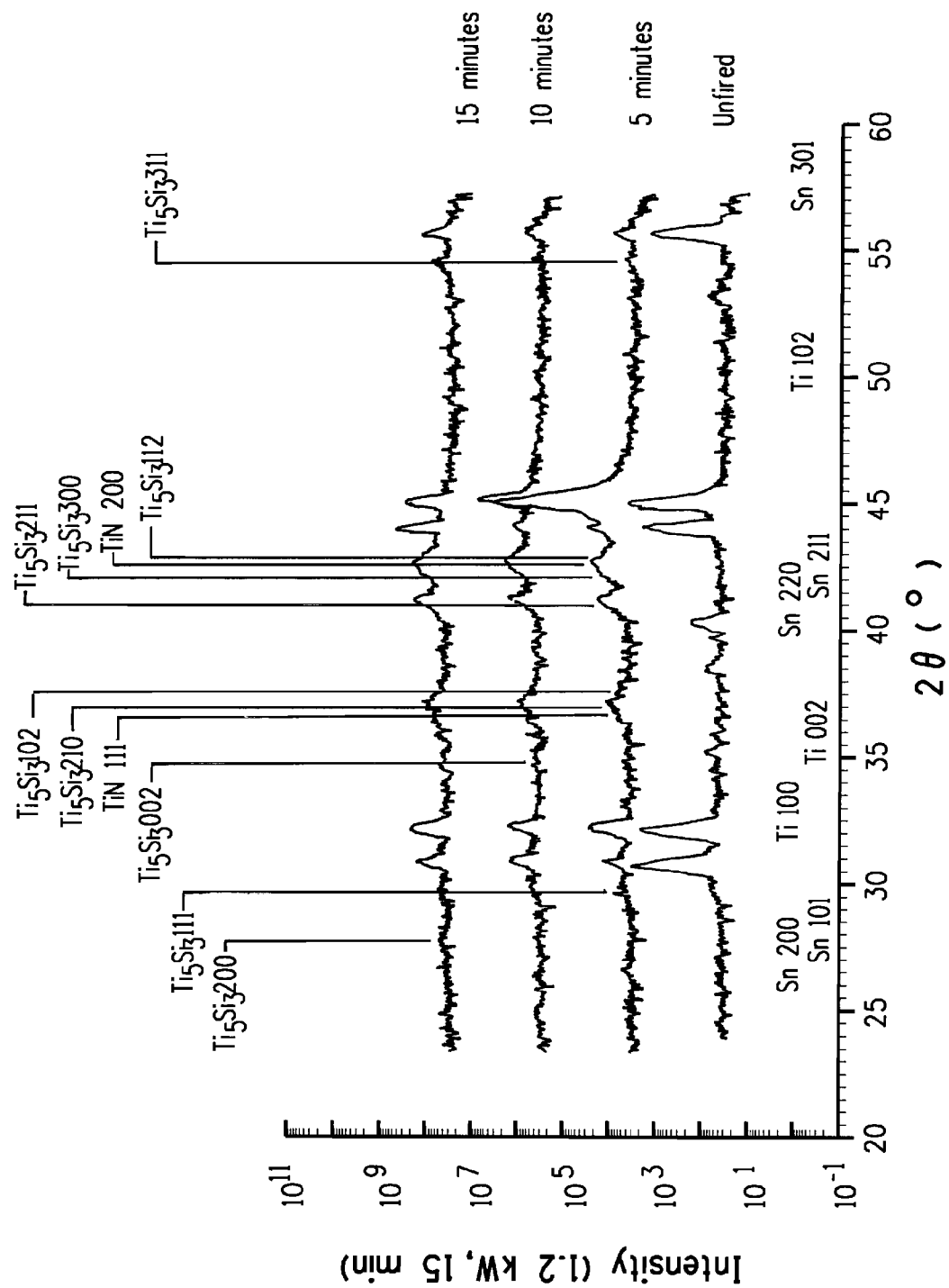
Figure 7:
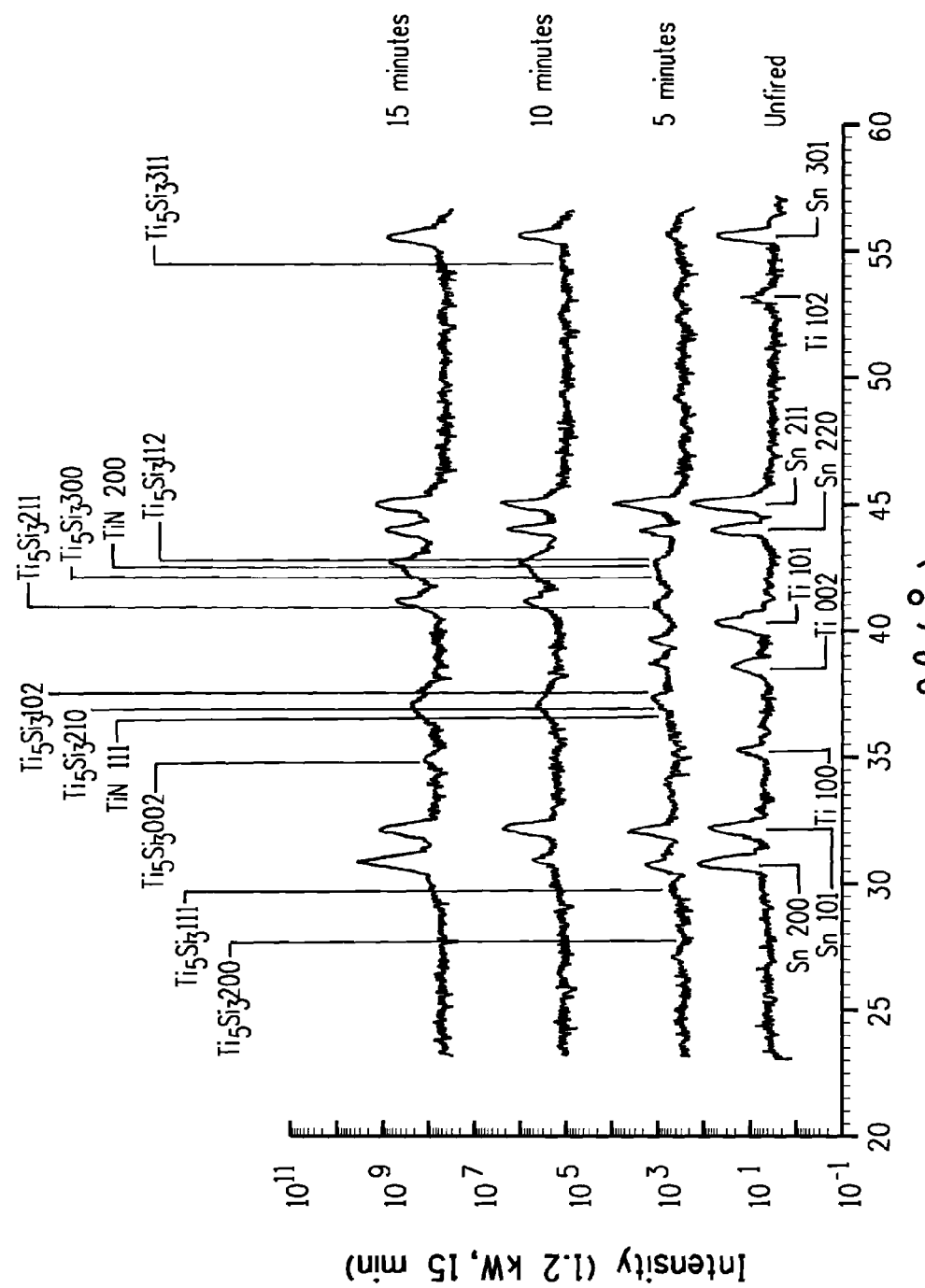
Figure 8:
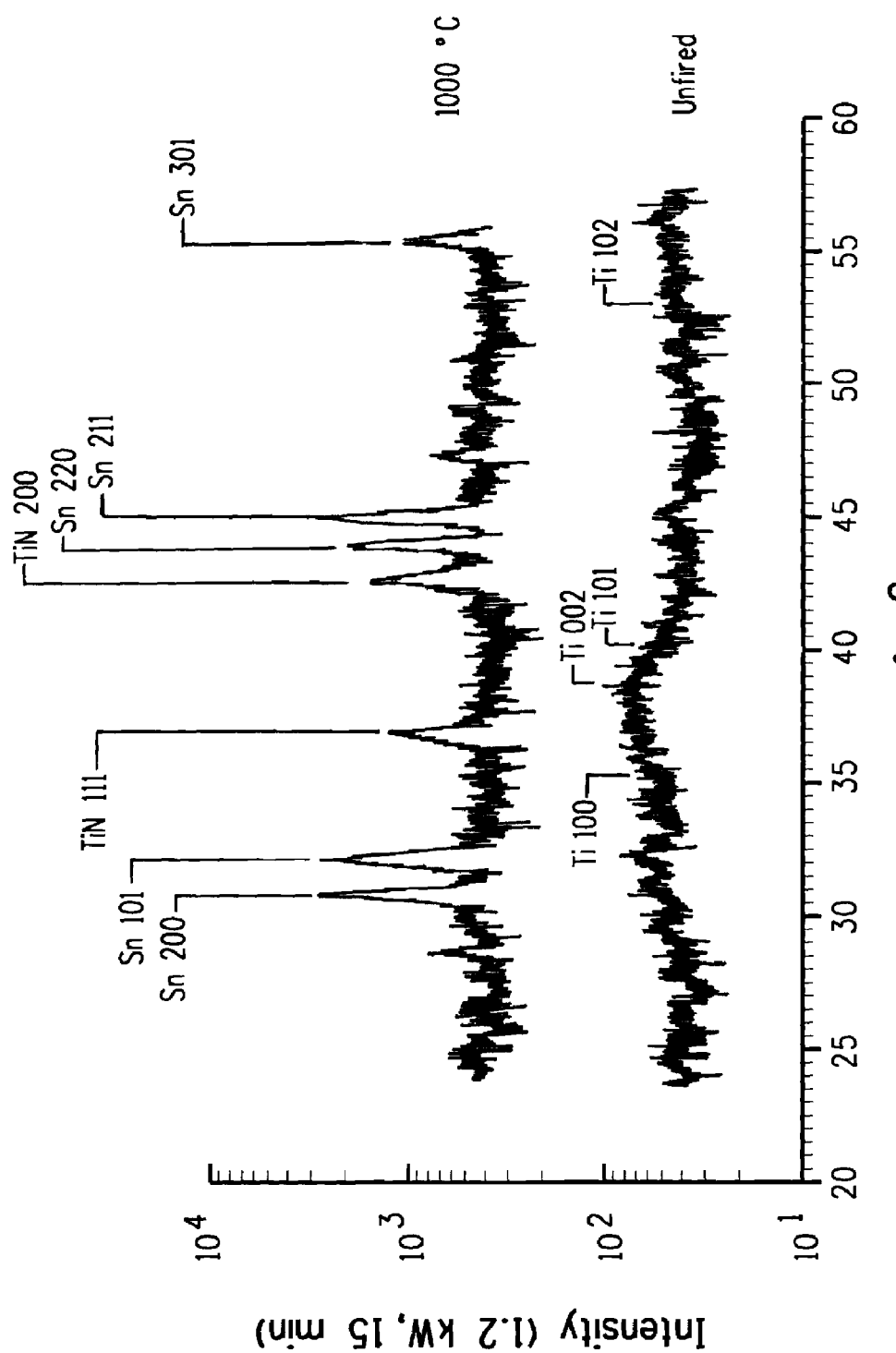

FIG. 6 shows a plot of X-ray data from Example 1.
FIG. 7 shows a plot of X-ray data from Example 2.
FIG. 8 shows a plot of X-ray data from Example 3.

According to common practice, the various features of the drawings discussed below are not necessarily drawn to scale. Dimensions of various features and elements in the drawings may be expanded or reduced to more clearly illustrate the embodiments of the invention.

DETAILED DESCRIPTION OF THE INVENTION

Photovoltaic devices having low Schottky barrier height electrode contacts to n-type silicon are disclosed. Also disclosed are methods for making photovoltaic devices having low Schottky barrier height electrode contacts to n-type silicon. The disclosed photovoltaic devices are solar cells but they may also be other photovoltaic devices having electrode contacts to n-type silicon such as photodetectors or light emitting diodes. The disclosed embodiment is a solar cell with a front face electrode on n-type silicon having a low Schottky barrier height electrode contact comprised of nitrides, and optionally silicides as well.

As used herein, the term "reactive metal" refers to a metal or mixtures of metals that form stable highly conductive metal nitrides, having a substantially more negative free energy of formation than silicon nitride. Such metals include transition metals or mixtures thereof such as metals from the group of titanium (Ti), zirconium (Zr), hafnium (Hf), tantalum (Ta), niobium (Nb) and vanadium (V). These reactive metals will transform silicon nitride to a highly conducting metal nitride by a redox reaction due to the large difference in negative free energy of formation. Such transition metal nitrides generally have the formula $M_zN$ wherein M is a transition metal from the group of titanium (Ti), zirconium (Zr), hafnium (Hf), tantalum (Ta), niobium (Nb) and vanadium (V), N is nitrogen, and z is from 1 to 2 or therebetween. Transition metal nitrides that may form include TiN, TaN, VN, $V_2N$, ZrN, NbN, $Nb_2N$ HfN, and combinations thereof. Thermodynamic analysis of this process is illustrated in FIG. 2 which shows a graph of free energy (delta G) versus temperature and the large difference in negative free energy of formation for silicon nitride and the nitrides of titanium, zirconium and hafnium.

As part of the reaction, if present in quantities larger than that of the nitrogen contained in the silicon nitride, the reactive metal will also form a conducting metal silicide from the reaction with the residual silicon in the silicon nitride and next by reaction with the underlying n-type silicon. Such silicides have the formula $M_xSi_y$, where M is a transition metal such as metals from the group of titanium (Ti), zirconium (Zr), hafnium (Hf), tantalum (Ta), niobium (Nb) and vanadium (V), Si is silicon, x can vary from 1 to 5 and therebetween, and y can vary from 1 to 3 and therebetween. Perfect stoichiometry may not occur so x and y, for example, in $M_1Si_1$ can be slightly less than 1 or slightly more than 1. Metal silicides that may form include $Ti_5Si_3$, TiSi, $TiSi_2$, $Ta_2Si$, $Ta_5Si_3$, $TaSi_2$, $V_3Si$, $V_5Si_3$, $ViSi_2$, $Zr_4Si$, $Zr_2Si$, $Zr_5Si_3$, $Zr_4Si_3$, $Zr_6Si_5$, ZrSi, $ZrSi_2$, HfSi, $HfSi_2$, or combinations thereof.

The thermodynamics of these reactions is substantially exothermic, and thus can be initiated and rapidly completed by a firing process. The transformation of silicon nitride and accompanying formation of titanium silicide can be approximately represented by the following equation using titanium as the example:

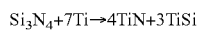

$$Si_3N_4 + 7Ti \rightarrow 4TiN + 3TiSi$$

FIG. 3 schematically illustrates the transformation process wherein the silicon nitride is transformed by titanium to titanium nitride and titanium silicide. Both TiN and TiSi are highly conductive. Other conductive silicides, such as $TiS_2$ and $Ti_5Si_3$ however, may be formed depending on the amount of titanium present. Reactive metals are very refractory and the nitrides and silicides made from them are also refractory so the reaction kinetics of the transformation reaction may be very slow unless a high temperature is used, such as greater than 800° C., and more preferably greater than 1000° C. for some period of time. However, the refractoriness of the reactive metals and their nitrides and silicides give them very low diffusivity and solubility in silicon making them ideal contacts for maintaining a high shunt resistance in the silicon solar cell.

The reactive metal may include small amounts of certain rare earth metals, such as lanthanum (La), cerium (Ce), dysprosium (Dy), erbium (Er), holmium (Ho), gadolinium (Gd) and the like rare earth metals such as scandium (Sc), and yttrium (Y) since they form very conductive disilicides and nitrides and may participate in the transformation reaction.

The nitrides and silicides formed from the above reaction, from the group of titanium (Ti), zirconium (Zr), hafnium (Hf), tantalum (Ta), niobium (Nb) and vanadium (V) have Schottky barrier heights in the order of 0.5 eV (electron volt) as shown in FIG. 4 (adapted from "Barrier Heights to n-Silicon", Andrews et al., J. Vac. Sci. Tech 11, 6, 972, 1974). The Schottky barrier heights of the rare earth (RE) silicides are also very low, in the order of 0.3 eV. Reactive metal nitrides and silicides, therefore, form lower Schottky barrier height contacts to n-type silicon than is the case with silver metal (ev of ~0.65 eV), the conventional contact for n-type silicon in silicon solar cells. An additional advantage of the reactive metal nitrides and silicides is that they are wetted very well by many molten metals.

As used herein, the term "non-reactive metal" refers to a metal or mixture of metals that cannot transform the silicon nitride to a conducting nitride and silicide. Non-reactive metals may be chosen to have relatively low electrical resistivities for current carrying and relatively low reactivity with silicon. Preferred non-reactive metals also have melting points close to or even less than the peak firing temperature. Metal compositions may be designed with multiple elements to achieve the desired melting point by use of eutectic compositions. The non-reactive metals may be chosen from, but not limited to, the group of metals, such as silver (Ag), tin (Sn), bismuth (Bi), lead (Pb), arsenic (As), antimony (Sb), zinc (Zn), germanium (Ge), nickel (Ni), gold (Au), cadmium (Cd), and berrylium (Be). Phosphorus (P), although not a metal, may also be included. Other metals, such as those with high melting points, such as palladium (Pd), for example, may be included in small quantities to achieve other specific properties. The metal mixture may have arsenic or antimony included, as they may additionally act as donor dopants to selectively dope the silicon under the paste during firing to further reduce its surface resistivity and improve the contact resistance. The non-reactive metal group typically does not include boron (B), aluminum (Al), gallium (Ga), indium (In), and thallium (Tl) as they may acceptor dope the n-type silicon and raise the surface resistivity too high.

The metals described above may be deposited on to the silicon nitride by thin film processes or thick film processes. Thin film processes include, but are not limited to, sputtering, metal evaporation, chemical vapor deposition, atomic layer deposition, pulsed laser deposition, and the like. The metals are deposited in their elemental state and may be deposited as separate layers or co-deposited to form mixtures or alloys.

Metals deposited by such thin film methods are generally deposited onto the surface of the silicon nitride through a mask or photoresist to define the pattern desired.

The metals may also be deposited by thick film processes. Thick film processes include screen printing, ink jet printing, or photo-imaging techniques, for example. Screen printing is advantageous in that it is a cost effective process. In this case, a paste containing the above metals in powder form are printed through a screen onto the surface of the silicon nitride. The screen defines the pattern desired.

Suitable powders for use in screen printing pastes made from reactive metals should be as free of oxide as possible so that the above reaction is not hindered by the native oxide of the reactive metal. Because reactive metals automatically form oxides in air to a predetermined thickness due to their oxidation characteristics, the larger the size of the powders, the lower the total oxide content. Firing the powders in a reducing atmosphere will prevent further substantial oxidation but atmospheres have to be extremely reducing to reduce the oxides of reactive metals to the metal. Therefore, it is preferable to use powders with the largest particle size consistent with good thick film paste making properties to minimize the oxide level. For optimum thick film paste properties, such powders should be between approximately 100 nanometers up to approximately 50 micrometers in size.

Suitable powders made from non-reactive metals should also be as free of oxide as possible. Such powders, particularly those with a small negative free energy of formation of their oxides, or noble metals, may be smaller in size than reactive metals as the oxides may be reduced to the metal by the reducing atmosphere during the firing process or they may not form oxides. However, those with a more negative free energy of oxide formation should have low oxygen content and hence larger particle sizes.

For thick film deposition, the metal powders described above are mixed with an organic medium by mechanical mixing to form viscous compositions called "thick film pastes", having suitable consistency and rheology for printing. The organic medium is a fugitive material, in that it is burnt off during the initial stages of the firing process. A wide variety of inert viscous materials can be used as organic medium. The organic medium must be one in which the metal powders are dispersible with an adequate degree of stability. The rheological properties of the medium must be such that they lend good application properties to the composition, including: stable dispersion of metal powders, appropriate viscosity and thixotropy for screen printing, appropriate paste wettability of the substrate, and a good drying rate. The organic vehicle used in the disclosed thick film composition is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium.

The most frequently used polymer of the organic medium is ethyl cellulose. Other useful of polymers for the organic medium include ethylhydroxyethyl cellulose, wood rosin, mixtures of ethyl cellulose and phenolic resins, polymethacrylates of lower alcohols, and monobutyl ether of ethylene glycol monoacetate.

The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 1 wt. % to 11 wt. % of the total composition depending on the polymer chosen. The thick film composition useful in certain embodiments of the invention may be adjusted to a predetermined, screen-printable viscosity with the organic medium.

The ratio of organic medium in the thick film composition to the metal components is dependent on the method of applying the paste and the kind of organic medium used, and it can vary. Usually, the dispersion will contain 70-95 wt % of metal components and 5-30 wt % of organic medium (vehicle) in order to obtain good wetting.

The low Schottky barrier height contact derived from the transformation of the silicon nitride may be approximately the same thickness as the silicon nitride (70 to 100 nanometers) or may be as much as several micrometers depending on the firing process, how much reactive metal is deposited and if reaction with the residual silicon or the underlying n-type silicon occurs. However, it is also advantageous to form a low resistivity current carrier to carry the current to the outside circuitry. As such, an electrode or additional metal layer of a low resistance is desirable. This may be accomplished by depositing a non-reactive metal layer over a reactive metal layer prior to or after the firing process. Another method is to co-deposit the non-reactive metal with the reactive metal in the appropriate quantities. The co-deposition approach may comprise mixtures of metals or an alloy of the reactive metal with the non-reactive metal. The amount of reactive metal in the mixture or alloy composition is tailored to the thickness of the silicon nitride and the thickness of the deposit, but typically the reactive metal will comprise about 1-25% of the metals in the composition.

A solar cell having low Schottky barrier height electrode contacts as described herein may be manufactured by the following methods.

Figure 5A:
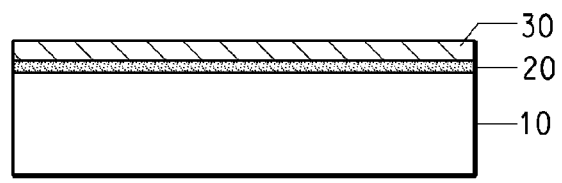
Figure 5B:
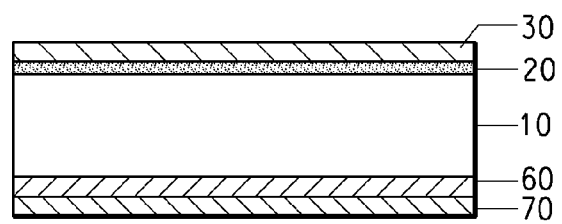

Referring to FIG. 5, the article shown in FIG. 5A is provided. The article may comprise single-crystal silicon or multicrystalline silicon, and includes a p-type silicon substrate 10, an n-type diffusion layer 20, and an anti-reflective coating 30 The article shown in FIG. 5A may be prepared as described above with regard to the article shown in FIG. 1D.

Figure 1D:
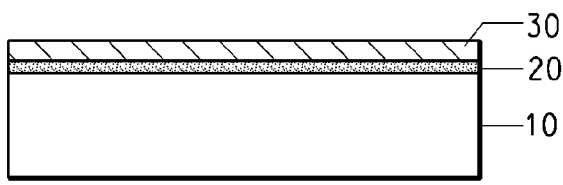
Figure 1E:
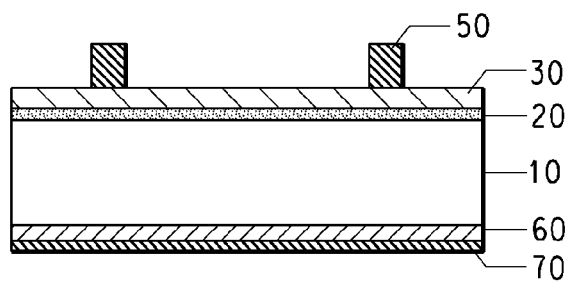
Figure 1F:
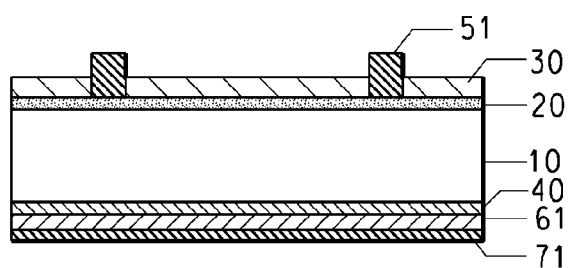

Referring to FIG. 5, the article of FIG. 1D is provided and shown as FIG. 5A. Referring to FIG. 5B, an aluminum paste 60 and a backside silver or silver/aluminum paste 70 are successively screen printed and dried on the backside of the substrate. Firing of the backside pastes is then carried out in an infrared furnace at a temperature range of approximately 700° C. to 975° C. in air for a period of from several minutes to several tens of minutes. The firing produces the article of FIG. 5C.

Figure 5C:
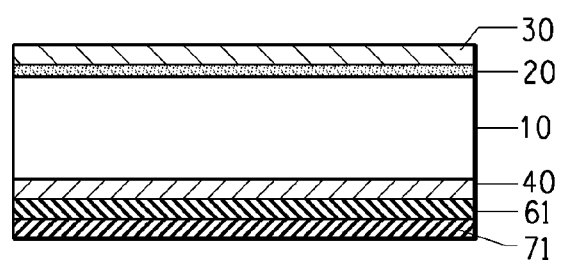

Referring to FIG. 5C, as in the conventional process, aluminum diffuses from the aluminum paste into the silicon substrate 10 as a dopant during firing, forming a p+ layer 40 containing a high concentration of aluminum dopant.

Firing converts the aluminum paste 60 to an aluminum back electrode 61. The backside silver or silver/aluminum paste 70 is fired at the same time, becoming a silver or silver/aluminum back electrode 71. During firing, the boundary between the back side aluminum and the back side silver or silver/aluminum assumes an alloy state, thereby achieving electricrial connection. The aluminum electrode accounts for most areas of the back electrode, owing in part to the need to form a p+ layer 40. Because soldering to an aluminum electrode is impossible, a silver back tab electrode is formed over portions of the back side as an electrode for interconnecting solar cells by means of copper ribbon or the like.

Figure 5D:
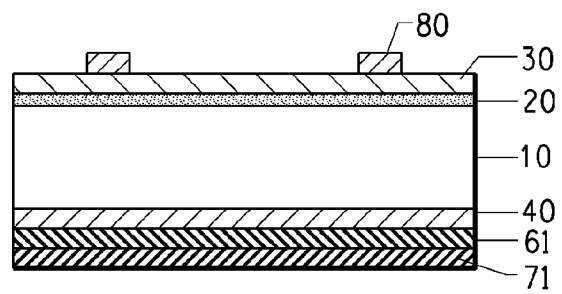

The novel metal composition(s) described herein is now applied by thick film or thin film deposition processes, onto the silicon nitride insulating film 30 in a pattern corresponding to the fingers and bussbars of the front electrode, shown as 80 in FIG. 5D. The deposition may be accomplished with separate deposition of the reactive metal followed by the non-reactive metal onto the same pattern (both layers shown as the single layer 80 in FIG. 5D) or by a single deposition of a mix of reactive and non-reactive metals or a reactive/non-reactive metal alloy. Alternatively, the reactive metal may be deposited without the not-reactive metal.

The deposited metal composition(s) is now fired. Firing is typically undertaken in a furnace at a temperature within the range of 400° C. to 1000° C., the actual temperature depending upon the metal composition. Firing at a temperature at the lower end of this range may be preferred because oxidation issues will be much reduced. Firing is typically undertaken in a reducing atmosphere that may comprise vacuum, pure nitrogen, a mixture of hydrogen and nitrogen or mixtures of other gases such as argon, carbon monoxide and/or water. Such gas mixtures may be used to control the partial pressure of oxygen during the firing process to avoid oxidation of the metals. The exact partial pressure of oxygen ($PO_2$) required to prevent oxidation is dependent on the metal compositions. Atmospheres that fully protect the metals from oxidation can be thermodynamically derived from standard free energy of formation of oxides as a function of temperature calculations or diagrams as disclosed in "F. D. Richardson and J. H. E Jeffes, J. Iron Steel Inst., 160, 261 (1948)". In general, however, a partial pressure of oxygen ($PO_2$) of between approximately $10^{-6}$ to $10^{-18}$ atmospheres is suitable, because the reactive metal will be heavily diluted by the non-reactive metal. This can be generally accomplished by the use of pure nitrogen, carbon monoxide/carbon dioxide mixtures, argon, forming gas (1-4% hydrogen in nitrogen), a mixture of hydrogen and argon, or vacuum. Use of argon may be advantageous as it may preclude any reaction between the reactive metal and nitrogen. Such an atmosphere may not completely protect the reactive metals from oxidation but the rate of oxidation will be severely depressed due to the non-reactive metal content and will not impede the transformation reaction. For additional protection, oxygen getters, such as titanium plates or setters may be used to scavenge oxygen from the gases.

Figure 5E:
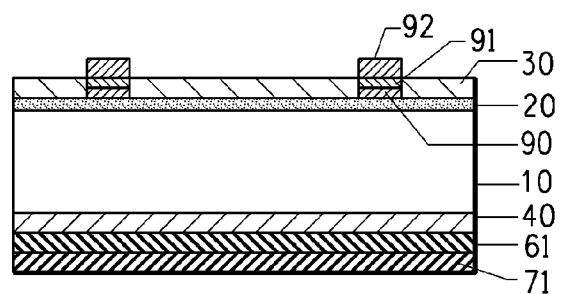

It is preferential to form a molten reactive metal alloy in the firing process. A molten metal allows for a reduction in the transformation reaction temperature due to an acceleration of the transformation kinetics via assistance of the liquid phase. In the case where the reactive metal is deposited first followed by the non-reactive metal or both metals are deposited as a mixture, the non-reactive metal melts and rapidly dissolves the reactive metal forming a molten alloy. In the case of a deposited alloy, the metal melts to form the molten alloy. While the metal is molten, the reactive metal preferentially migrates through the molten metal to the silicon nitride interface and reacts with the silicon nitride to form the reactive metal nitride and silicide. As the reactive metal is depleted at the interface, more reactive metal migrates to the interface to react. This continues until either the reactive metal in the molten alloy is consumed in forming the nitride and silicide or the reaction is terminated by cessation of the firing process. The inclusion of the molten metal in the process accelerates the kinetics of transforming the silicon nitride to the reactive metal nitride and silicide so that the firing can be accomplished at a relatively low temperature, such as between 400° C. and 1000° C. Referring to FIG. 5E, the firing forms an electrode comprising the following elements: a) a metal nitride first layer 90 formed from the transformation of the anti-reflective coating 30 and reactively bonded to the underlying n-type silicon 20, b) a metal silicide second layer 91 formed on the nitride layer 90 and c) a metal third layer 92 formed from the molten metal.

While it is preferential to form a molten reactive metal alloy during the firing process, it is entirely feasible that the firing not melt the non-reactive metal and that the transformation process occus in the solid state. Finally, it is also feasible that the process steps described herein can be modified so that the novel composition(s) described herein may be co-fired with the backside pastes.

Example 1

Titanium (Ti) metal powder, tin (Sn) metal powder and alfa silicon nitride ($Si_3N_4$) were mixed in proportions that would correspond to the composition of $Ti_{0.2}Sn_{0.8}$ and $Si_3N_4$ with a Ti to N ratio of unity. The titanium powder was <325 mesh or approximately 35 micrometers in diameter. The tin was approximately 0.1 micrometer in diameter and the alfa silicon nitride was less than 2 micrometers in diameter. Pellets were made from the composition by pressing. The pellets were then heated in argon to 800° C. and pellets were withdrawn after 5, 10 and 15 minutes.

The firing temperature of 800° C. would be expected to form and melt the composition $Ti_{0.2}Sn_{0.8}$. The pellets were X-rayed to examine the reaction products. FIG. 6 shows the X-ray data from before firing and after various firing durations. As can be seen and as expected, the unfired pellet X-ray shows only tin, titanium and titanium dioxide. The titanium dioxide is the oxide layer on the surface of the powder. Silicon nitride does not show on the X-rays as the alpha phase is amorphous. After firing at the various times, the X-ray data shows that that titanium nitride (TiN) and some small amounts of titanium silicide ($Ti_5Si_3$) have formed.

Example 2

Titanium (Ti) metal powder, tin (Sn) metal powder and alfa silicon nitride ($Si_3N_4$) were mixed in proportions that would correspond to the composition of $Ti_6Sn_5$ and $Si_3N_4$ with a Ti to N ratio in excess of 1 to compensate for surface oxide on the titanium and provide a small excess titanium. The titanium powder was <325 mesh or approximately 35 micrometers in diameter. The tin was approximately 0.1 micrometer in diameter and the alfa silicon nitride was less than 2 micrometers in diameter. Pellets were made from the composition by pressing. The pellets were then heated in argon to 800° C. and pellets were withdrawn after 5, 10 and 15 minutes. In this case, the firing temperature of 800° C. would be expected to form $Ti_6Sn_5$ but would not be expected to melt the composition $Ti_6Sn_5$. The pellets were X-rayed to examine the reaction products. FIG. 7 shows the X-ray data. As can be seen and as expected, the unfired pellet X-ray shows only tin, titanium and titanium dioxide and the titanium content is clearly greater than that exhibited in Example 1. The titanium dioxide is the oxide layer on the surface of the powder. Silicon nitride does not show on the X-rays as the alpha phase is amorphous. After firing at the various times, the X-ray data shows that titanium nitride (TiN) and titanium silicide ($Ti_5Si_3$) have formed.

Example 3

A crystalline silicon solar cell substrate coated with an approximately 70 nanometers thick layer of silicon nitride on its surface was placed in a sputter chamber and 300 nanometers of titanium and tin were co-deposited on the surface. The deposited amounts were calculated to have no excess titanium to nitrogen in the silicon nitride. The composition of the deposit would corresponded approximately to $Ti_6Sn_5$ The solar cell was fired at 1000° C. for 30 minutes in forming gas (4% hydrogen in nitrogen). After firing, the surface of the solar cell was X-rayed. FIG. 8 shows the X-ray before and after firing. As can be seen, prior to firing the X-ray is largely amorphous as would be expected. After firing, clear evidence of titanium nitride (TiN) is seen.

The above examples show that silicon nitride can be transformed to a conductive nitride or silicide or both by a titanium reactive metal at relatively low temperatures as a result of the presence of a low melting point metal. The examples also show that this transformation can be accomplished in powder form as evidenced by the pellets of Examples 1 and 2 or by vacuum deposited metals as evidenced by Example 3.

What is claimed is:

1. A method for making a photovoltaic device, comprising:
providing a silicon substrate having an n-type silicon layer;
forming a silicon nitride layer on the n-type silicon layer of the silicon substrate;
placing a reactive metal in contact with said silicon nitride layer and not in contact with said n-type silicon layer of said silicon substrate;
placing a non-reactive metal in contact with said reactive metal, wherein said reactive metal makes up between 1 and 25 weight percent of the total weight of the reactive and non-reactive metals;
firing said silicon substrate, silicon nitride layer, reactive metal and non-reactive metal such that said reactive metal transforms said silicon nitride to form a low Schottky barrier height contact to said n-type silicon layer, said low Schottky barrier height contact comprised of one or more conductive metal nitrides, and such that a conductive metal electrode is formed in contact with said low Schottky barrier height contact.

2. The method of claim 1 wherein said low Schottky barrier height contact further comprises one or more metal silicides.

3. The method of claim 1 wherein the reactive metal is selected from titanium, zirconium, hafnium, vanadium, niobium, and tantalum.

4. The method of claim 1 wherein the reactive metal further comprises a metal selected from the group of lanthanum, cerium, dysprosium, erbium, holmium, gadolinium, scandium, and yttrium.

5. The method of claim 1 wherein the non-reactive metal is one or more metals from the group of silver, tin, bismuth, lead, arsenic, antimony, zinc, germanium, phosphorus, nickel, gold, cadmium, and berrylium.

6. The method of claim 1 wherein reactive metal and the non-reactive metal are combined to form a metals composition, and said metals composition is subsequently deposited on said silicon nitride layer.

7. The method of claim 6 wherein the reactive metal of is in the form of particles having an average diameter in the range of 100 nanometers to 50 micrometers.

8. The method of claim 7 wherein the non-reactive metal is in the form of particles having an average diameter in the range of 100 nanometers to 50 micrometers.

9. The method of claim 1 wherein said silicon substrate, silicon nitride layer, reactive metal and non-reactive metal are fired at a temperature between 400° C. and 1000° C.

10. The method of claim 9 wherein the silicon substrate, silicon nitride layer and reactive metal are fired in a reducing atmosphere.

11. A method for making a silicon solar cell, comprising:
providing a silicon substrate having an n-type silicon layer,
forming a silicon nitride antireflective layer on the n-type silicon layer of the silicon substrate;
placing a reactive metal in contact with said silicon nitride antireflective layer and not in contact with said n-type silicon layer of said silicon substrate,
firing said silicon substrate, silicon nitride layer, and reactive metal such that said reactive metal transforms said silicon nitride to form a low Schottky barrier height contact to said n-type silicon layer, said low Schottky barrier height contact comprised of one or more conductive metal nitrides.

12. The method of claim 11 further comprising the step of placing a non-reactive metal in contact with said reactive metal before the firing, to form a conductive metal electrode in contact with said low Schottky barrier height contact.

13. The method of claim 12 wherein the reactive metal is placed in contact with the silicon nitride antireflective layer by thin film deposition and the non-reactive metal is placed in contact with the reactive metal by thin film deposition.

14. The method of claim 12 wherein the reactive metal is placed in contact with the silicon nitride antireflective layer by thick film deposition and the non-reactive metal is placed in contact with the reactive metal by thick film deposition.

15. The method of claim 12 wherein the thickness of the antireflective coating is in the range of 70 to 90 nanometers.

16. The method of claim 12 wherein said low Schottky barrier height contact further comprises one or more metal silicides.

17. The method of claim 12 wherein the reactive metal is one or more metals selected from titanium, zirconium, hafnium, vanadium, niobium, and tantalum,
and wherein the non-reactive metal is one or more metals selected from silver, tin, bismuth, lead, antimony, arsenic, zinc, germanium, nickel, phosphorus, gold, cadmium, and berrylium.

* * * * *